(12) United States Patent
Lee et al.

(10) Patent No.: US 10,996,716 B2
(45) Date of Patent: May 4, 2021

(54) DISPLAY DEVICE

(71) Applicant: LG Display Co., Ltd., Seoul (KR)

(72) Inventors: Shin-Suk Lee, Gimpo-si (KR);
Seung-O Jeon, Seoul (KR);
Young-Joon Yun, Goyang-si (KR);
Hyeong-Gwang An, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/667,485

(22) Filed: Oct. 29, 2019

(65) Prior Publication Data

US 2020/0166971 A1     May 28, 2020

(30) Foreign Application Priority Data

Nov. 27, 2018    (KR) .................. 10-2018-0148120

(51) Int. Cl.
     *G06F 1/16*      (2006.01)

(52) U.S. Cl.
     CPC .......... *G06F 1/1652* (2013.01); *G06F 1/1624* (2013.01); *G06F 1/1681* (2013.01)

(58) Field of Classification Search
     CPC ..... G06F 1/1624; G06F 1/1652; G06F 1/1681
     USPC .............. 361/679.26, 679.27, 679.3, 679.55, 361/679.56
See application file for complete search history.

(56) References Cited

U.S. PATENT DOCUMENTS

| | | | |
|---|---|---|---|
| 8,804,324 B2* | 8/2014 | Bohn | G06F 1/1681 361/679.27 |
| 9,176,535 B2* | 11/2015 | Bohn | H04M 1/0268 |
| 10,459,493 B2* | 10/2019 | Lee | E05D 1/00 |
| 2012/0002360 A1* | 1/2012 | Seo | G06F 1/1652 361/679.01 |
| 2017/0243526 A1* | 8/2017 | Lim | G06F 1/1652 |
| 2018/0124937 A1 | 5/2018 | Choi et al. | |
| 2018/0210512 A1* | 7/2018 | Lin | H04M 1/022 |
| 2019/0339742 A1* | 11/2019 | Jia | G06F 1/1681 |
| 2019/0346889 A1* | 11/2019 | Chen | G06F 1/1616 |

OTHER PUBLICATIONS

European Patent Office, Extended European Search Report, EP Patent Application No. 19211105., dated May 7, 2020, five pages.

* cited by examiner

*Primary Examiner* — Anthony Q Edwards
(74) *Attorney, Agent, or Firm* — Fenwick & West LLP

(57) ABSTRACT

A display device includes first and second set frames disposed adjacent to each other, a panel disposed above the first and second set frames, a folding hinge configured to connect the first set frame with the second set frame, a first sliding plate disposed between the first set frame and the panel, a stationary plate disposed between the second set frame and the panel, a second sliding plate disposed between the stationary plate and the second set frame, and a shock absorber having one end coupled to the first sliding plate and the panel and the other end coupled to the second sliding plate and movably disposed on the folding hinge.

20 Claims, 3 Drawing Sheets

DISPLAY DEVICE

CROSS-REFERENCE TO RELATED APPLICATIONS

This application claims the benefit of Republic of Korea Patent Application No. 10-2018-0148120, filed on Nov. 27, 2018, which is hereby incorporated by reference as if fully set forth herein.

BACKGROUND

Field

The present disclosure relates to a display device, and more particularly, to a foldable display device.

Discussion of the Related Art

In the recent information society, importance of a display device or a display has been emphasized as a visual information delivery medium. In order to take a leading place in the future, it is necessary to satisfy requirements such as low power consumption, thinness, light weight, and high image quality.

A display may be divided into an emissive display, which can emit light by itself, such as a cathode ray tube (CRT), an electroluminescent (EL) device, a light emitting diode (LED), a vacuum fluorescent display (VFD), a field emission display (FED), a plasma display panel (PDP), or an organic light emitting diode (OLED); and a non-emissive display, which cannot emit light by itself, such as a liquid crystal display (LCD).

Meanwhile, with progress of technology, instead of a glass substrate without flexibility applied to an existing display, a flexible display device manufactured using a flexible material such as plastic to maintain display performance even when the display device is bent like paper is rapidly emerging as a next-generation display device.

The flexible display device may be divided into an unbreakable type, a bendable type, a rollable type, and a foldable type with high durability using a plastic thin-film transistor substrate instead of glass. Such a flexible display device is advantageous in space usage, interior decoration, and design and has various application fields.

In particular, in recent years, in order to realize a large area along with ultra-thinness, light weight, and downsizing, foldable display devices capable of being carried in a folded state and displaying an image in an unfolded state have been actively studied.

The foldable display devices are applicable not only to mobile devices such as mobile phones, ultra-mobile personal computers (PCs), electronic books, or electronic newspapers but also to various fields such as TVs or monitors.

A foldable display device includes a hinge mechanism for enabling folding and unfolding.

Here, a generally used hinge mechanism uses a multi-link hinge having various structures including a chain or a 2-axis folding hinge connected to a central body including two hinge shafts.

However, since such a hinge mechanism has a stepped portion or a discontinuous exposure structure to enable folding and unfolding operation, a panel or an internal structure may be damaged by shock.

SUMMARY

Accordingly, the present disclosure is directed a display device that substantially obviates one or more problems due to limitations and disadvantages of the related art.

One aspect of the present disclosure is to provide a foldable display device capable of preventing a panel or an internal structure from being damaged, by absorbing shock even when shock is applied to a hinge mechanism to ensure sufficient durability against external load.

Additional advantages, aspects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these aspects and other advantages and in accordance with the purpose of the disclosure, as embodied and broadly described herein, a display device is provided. According to an aspect of the present disclosure, a display device includes first and second set frames disposed adjacent to each other, a panel disposed above the first and second set frames, a folding hinge connecting the first set frame with the second set frame, a first sliding plate disposed between the first set frame and the panel, a stationary plate disposed between the second set frame and the panel, a second sliding plate disposed between the stationary plate and the second set frame, and a shock absorber having one end coupled to the first sliding plate and the panel and another end, which is opposite to the one end, coupled to the second sliding plate and movably disposed on the folding hinge.

The shock absorber may be coupled to an upper surface and one side surface of the first sliding plate.

The shock absorber may be coupled to one side surface of the second sliding plate.

The other end of the shock absorber may be movably disposed below the stationary plate.

The shock absorber may be movably located below the panel to cover an upper surface of the folding hinge.

The first sliding plate may include any one of aluminum (Al), magnesium (Mg) or stainless steel (SUS), and the shock absorber may include any one of polyurethane or silicone.

The first set frame may include a first sliding section and a first spring fixed to a lower surface of the first sliding plate and provided in the first sliding section.

The second set frame may include a second sliding section and a second spring fixed to another side surface of the second sliding plate, which is opposite to the one side surface of the second sliding plate, and provided in the second sliding section.

The display device may further include a second shock absorber disposed between the stationary plate and the panel.

An upper surface of the second shock absorber may be coupled to the panel and a lower surface thereof may be coupled to the stationary plate.

The second shock absorber may be provided in at least a section in which the shock absorber is not provided.

A thickness of the second shock absorber may be less than that of the shock absorber.

The second shock absorber may include any one of polyurethane or silicone.

According to another aspect of the present disclosure, a display device includes a panel, a folding hinge disposed below the panel, a first sliding plate disposed on one side of the folding hinge, a second sliding plate disposed on another side of the folding hinge, which is opposite to the one side of the folding hinge, and a shock absorber having one end coupled to the first sliding plate and the panel and another end, which is opposite to the one end, coupled to the second sliding plate and movably disposed on the folding hinge.

The one end of the shock absorber may be coupled to an upper surface and one side surface of the first sliding plate and the other end thereof may be coupled to one side surface of the second sliding plate.

The display device may further include a stationary plate disposed above the second sliding plate, and the other end of the shock absorber may be movably disposed below the stationary plate.

The shock absorber may be movably located below the panel to cover an upper surface of the folding hinge.

The display device may further include a second shock absorber disposed between the stationary plate and the panel.

An upper surface of the second shock absorber may be coupled to the panel and a lower surface thereof may be coupled to the stationary plate.

The second shock absorber may be provided in at least a section in which the shock absorber is not provided.

According to another aspect of the present disclosure, a display device includes a panel, a folding hinge disposed below the panel, a first sliding section disposed on one side of the folding hinge, a first sliding plate disposed in the first sliding section to be movable by a first spring, a second sliding section disposed on another side of the folding hinge, which is opposite the one side of the folding hinge, a second sliding plate disposed in the second sliding section to be movable by a second spring, and a shock absorber having one end coupled to the first sliding plate and the panel and another end, which is opposite to the one end, coupled to the second sliding plate and movably disposed on the folding hinge.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION

Figure 1:
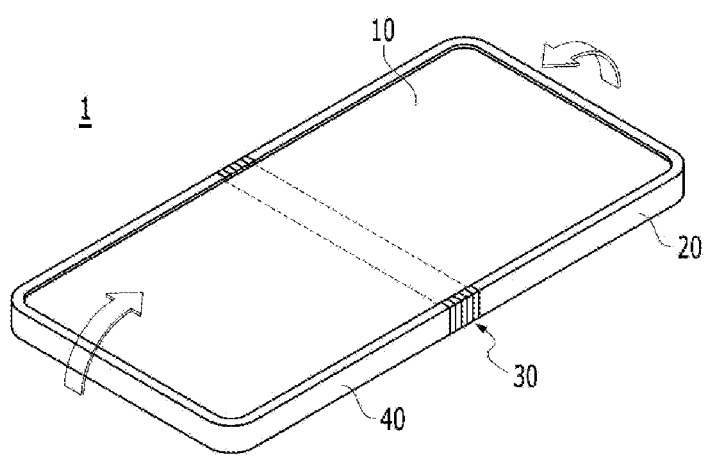
FIG. 1 is a view showing an unfolded state of a general foldable display device including a chain hinge.

Hereinafter, embodiments will be become more apparent from the accompanying drawings and the description of the embodiments. In description of the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. It will also be understood that "on" and "under" the element is described relative to the drawings.

In the drawings, dimensions may be exaggerated, omitted or schematically illustrated, for convenience and clarity of description. In addition, the size of each component does not entirely reflect the actual size. The same reference numbers will be used throughout the specification to refer to the same or like constituent elements. Hereinafter, embodiments will be described with reference to the accompanying drawings.

Figure 2:
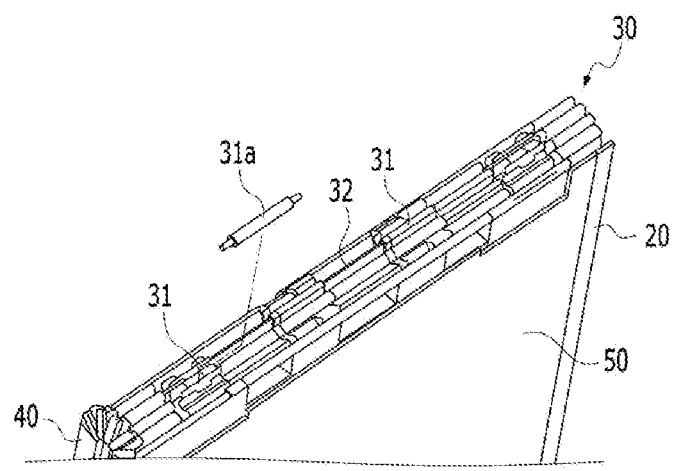
FIG. 2 is a view showing a chain hinge in a folded state of the foldable display device of FIG. 1.

FIG. 1 is a view showing an unfolded state of a general foldable display device including a chain hinge, and FIG. 2 is a view showing a chain hinge in a folded state of the foldable display device of FIG. 1.

Referring to FIGS. 1 and 2, the general foldable display device 10 having a chain hinge as a hinge mechanism is disclosed. The chain hinge 30 is located between a first frame 20 and a second frame 40 to support a panel 10, such that folding or unfolding operation is possible.

Here, the chain hinge 30 is formed by connecting a plurality of chain segments through a hinge pin 31a and has a protrusion region 31 and a recessed region 32, to which the hinge pin 31a is coupled.

However, in such a hinge mechanism, a panel or an internal structure may be damaged when shock is applied to a stepped portion or a discontinuous exposure structure of the protrusion region 31 and the recessed region 32.

The present disclosure may provide the following embodiments in order to solve the above-described problems.

Figure 3:
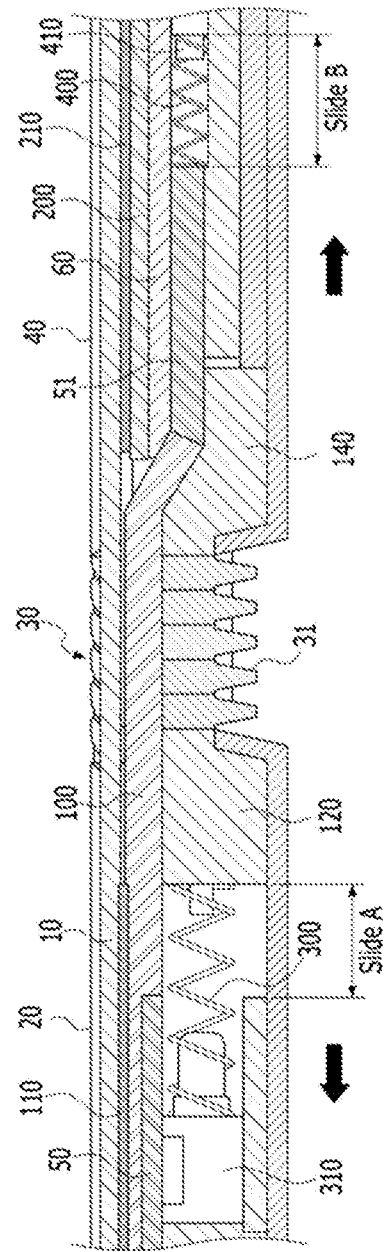
FIG. 3 is a side cross-sectional view of a display device according to an embodiment of the present disclosure in an unfolded state.
Figure 4:
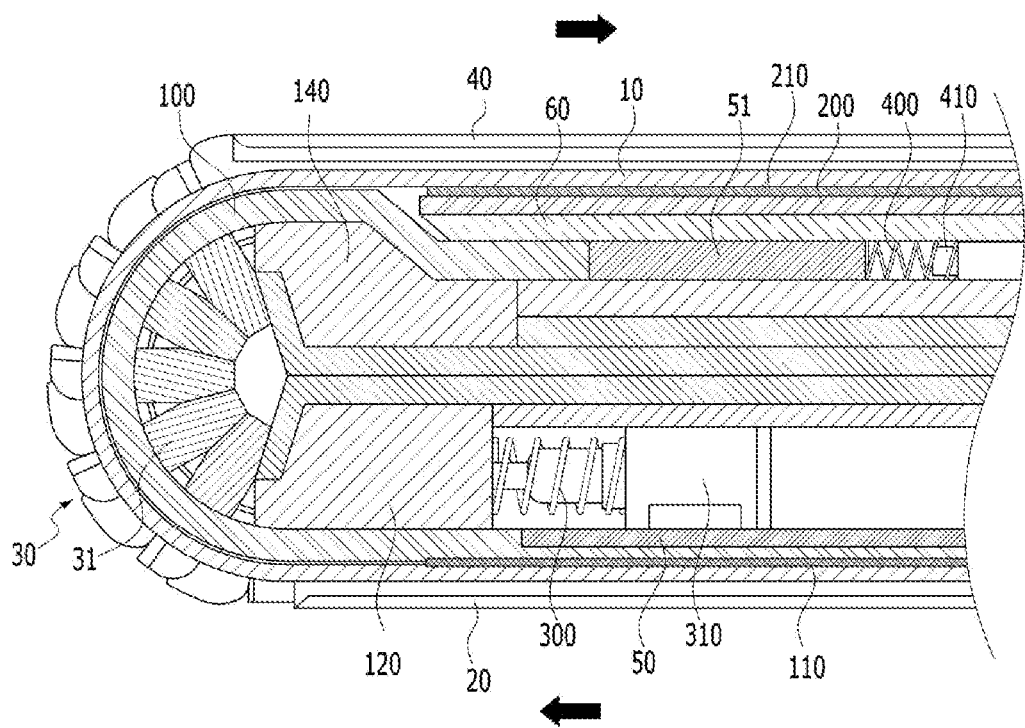
FIG. 4 is a view showing a folded state of the folding hinge of FIG. 3 according to an embodiment of the present disclosure.

FIG. 3 is a side cross-sectional view of a display device according to an embodiment of the present disclosure in an unfolded state, and FIG. 4 is a view showing a folded state of the folding hinge of FIG. 3 according to an embodiment of the present disclosure.

Referring to FIGS. 3 and 4, the display device according to the embodiment of the present disclosure includes a first frame 20, a second frame 40, a first set frame 120, a second set frame 140, and a folding hinge 30.

The first set frame 120 and the second set frame 140 may be disposed adjacent to each other, thereby supporting a panel 10. For example, the first set frame 120 may be located inside the first frame 20 and the second set frame 140 may be disposed inside the second frame 40.

The panel 10 includes a display region in which an image is displayed by a pixel array having a plurality of pixels. The display region may include a first display region in which the first set frame 120 is located, a second display region in which the second set frame 140 is located, and a bending region.

The first set frame 120 may be disposed adjacent to the second set frame 140 with the bending region interposed therebetween. The bending region may be defined between the first display region and the second display region of the panel 10. The bending region may be unfolded in a planar state or bent in a curved shape with a predetermined radius of curvature, according to a folded or unfolded state.

The first frame 20 may support or accommodate various parts (e.g., the first set frame 120) corresponding to the first display region of the panel 10, and the second frame 40 may support or accommodate various parts (e.g., the second set frame 140) corresponding to the second display region of the panel 10.

Selectively, the first display region and the second display region may have, without being limited to, the same size, and any one thereof may have a larger size. In this case, when the panel 10 is folded, a portion of the display region having a relatively large size may be exposed to the outside, and a date, a time, a battery residual value and a notification may be continuously displayed in the portion of the display region exposed to the outside even when the display device is turned off.

Here, the panel 10 may be a flexible organic light emitting display panel, a flexible electrophoretic display panel, a flexible electrowetting display panel, or a flexible quantum dot display panel.

The panel 10 may be located above the first set frame 120 and the second set frame 140 and may be located outside the first set frame 120 and the second set frame 140 in the folded state, as shown in FIG. 4. As necessary, the panel 10 may be disposed below the first set frame 120 and the second set frame 140. In some embodiments, panels 10 may be located inside and outside the frames in the folded state or only one panel may be located inside or outside the frames.

Here, folding may be defined as including folding or unfolding of the bending region and may be implemented through the folding hinge 30.

The folding hinge 30 may be disposed between the first set frame 120 and the second set frame 140. The folding hinge 30 may be assembled by connecting a plurality of chain segments 31 using a hinge pin 31a (see FIG. 2) and may be referred to as a chain hinge. In addition, the folding hinge 30 is not limited to the above-described type and may include various types of hinge mechanisms.

The folding hinge 30 shown in FIGS. 3 and 4 connects the first set frame 120 and the second set frame 140 by continuously connecting the plurality of chain segments 31, and implements outer folding operation with respect to the panel 10 placed thereabove.

Meanwhile, the display device of the present embodiment may further include a first sliding plate 50, a second sliding plate 51, a stationary plate 60, and a shock absorber 100.

The first sliding plate 50 may be disposed between the first set frame 120 and the panel 10 to perform sliding operation above the first set frame 120 during folding/unfolding operation.

The second sliding plate 51 may be disposed between the second set frame 140 and the stationary plate 60 located on the second set frame 140 to perform sliding operation above the second set frame 140.

The first sliding plate 50 and the second sliding plate may include any one of aluminum (Al), magnesium (Mg), or stainless steel (SUS).

The stationary plate 60 may be disposed between the second set frame 140 and the panel 10 and may be held at a stationary position even during sliding operation of the first sliding plate 50 and the second sliding plate 51.

The shock absorber 100 serves to absorb external shock from the folding hinge 30 and the panel 10 to protect internal parts. The shock absorber 100 may be referred to as a shock absorption layer, a shock preventer, a shock preventing layer, etc.

One end of the shock absorber 100 may be coupled (for example, fixed or attached) to the first sliding plate 50 and the panel 10, and the other end thereof may be coupled (for example, fixed or attached) to the second sliding plate 51. The shock absorber 100 may be movably disposed on the folding hinge 30.

At this time, an upper surface and one side surface of the first sliding plate 50 may be coupled to the shock absorber 100. That is, the shock absorber 100 may be fixed to the upper surface and one side surface of the first sliding plate 50. Here, the upper surface of the shock absorber 100 and the lower surface of the panel 10 may be fixed by a first panel fixer 110. For example, the first panel fixer 110 may be an adhesive tape, an adhesive, etc.

In addition, the other end of the shock absorber 100 may be coupled to one side surface of the second sliding plate 51 and the shock absorber 100 may be movably disposed below the stationary plate 60. In addition, the shock absorber 100 may have a large size to cover the upper surface of the folding hinge 30.

The shock absorber 100 is widely located on the panel 10 and the folding hinge 30 to absorb external shock and to ensure sufficient durability against external load, thereby preventing the panel 10 or the internal structure from being damaged. To this end, the shock absorber 100 may include any one of flexible polyurethane or silicone as a shock absorption material.

Since the first sliding plate 50 is formed of a material different from that of the shock absorber 100, the first sliding plate 50 and the shock absorber 100 may be integrally manufactured by double injection molding, thereby simplifying parts and improving ease of assembly.

Meanwhile, the first set frame 120 may further include a first sliding section Slide A, a first spring 300, and a first spring fixer 310. The first sliding section Slide A may be located below the first sliding plate 50 to control sliding of the first sliding plate 50.

The first spring 300 may be fixed to the lower surface of the first sliding plate 50 and may be provided in the first sliding section Slide A. The first spring fixer 310 may be connected to the first spring 300 such that the first spring 300 is fixed to the lower surface of the first sliding plate 50. Accordingly, the first sliding plate 50 may be provided in the first slide section Slide A to be movable by the first spring 300.

In addition, the second set frame 140 may further include a second sliding section Slide B, a second spring 400, and a second spring fixer 410. The second sliding section Slide B may be located below the second sliding plate 51 to control sliding of the second sliding plate 51.

The second spring 400 may be fixed to the other side of the second sliding plate 51 and may be provided in the second sliding section Slide B. The second spring fixer 410 may be connected to the second spring 400 such that the second spring 400 is fixed to the other side of the second sliding plate 51. Accordingly, the second sliding plate 51 may be provided in the second slide section Slide B to be movable by the second spring 400.

The first spring 300 and the second spring 400 may move the first sliding plate 50 and the second sliding plate 51 by tensile force to flatten the panel 10, during unfolding. At this time, the tensile force of the first spring 300 may be greater than that of the second spring 400. If the tensile force of the second spring 400 is large, the panel 10 located on the folding hinge 30 may become convex or a degree of flatness may be lowered. In addition, the first spring 300 may be a compression spring and the second spring 400 may be a compression/tension spring.

Meanwhile, since the shock absorber 100 absorbs external shock applied to the panel 10 located on the first set frame 120, the folding hinge 30, and a portion of the upper region of the second set frame 140, it may be difficult to absorb shock applied to the panel 10 located on the remaining region of the second set frame 140.

To this end, a second shock absorber 200 fixed between the panel 10 and the stationary plate 60 located on the second set frame 140 may be further included. The second shock absorber 200 may be provided in a region in which the shock absorber 100 is not provided or may partially overlap the shock absorber 100. That is, the shock absorber 100 may mainly absorb the shock of the folding region and the second shock absorber 200 may mainly absorb the shock of the unfolding region.

The second shock absorber 200 may fix the upper surface of the stationary plate 60 and the lower surface of the panel 10 and the position thereof may be fixed by a second panel fixer 210. For example, the second panel fixer 210 may be an adhesive tape, an adhesive, etc.

Similarly, the second shock absorber 200 may include any one of polyurethane or silicone. In addition, the thickness of the second shock absorber 200 may be less than that of the shock absorber 100 due to the above-described structure.

According to the display device of the embodiment including the above-described configuration, it is possible to smoothly implement folding/unfolding by the folding hinge. In addition, when shock is applied to the hinge structure, the shock absorber absorbs shock and ensures sufficient durability against external load, thereby preventing the panel or the internal structure from being damaged.

The display device according to various embodiments of the present disclosure is applicable to various electronic apparatuses such as TVs, smartphones, tablet PCs, etc.

According to the display device of the present disclosure, even when shock is applied to the hinge structure, the shock absorber located in a folding section may absorb shock and ensure sufficient durability against external load, thereby preventing the panel or the internal structure from being damaged.

In addition, the display device of the present disclosure has shock absorbers provided in a folding section and an unfolding section, thereby further increasing durability against external shock.

The features, structures, effects and the like described in the embodiments are included in at least one embodiment of the present invention, and are not necessarily limited to only one embodiment. Furthermore, the features, structures, effects and the like illustrated in the embodiments can be combined and modified by those skilled in the art, to which the embodiments pertain. Accordingly, such combinations and modifications are construed as being within the scope of the present disclosure.

What is claimed is:

1. A display device comprising:
    a first set frame and a second set frame disposed adjacent to each other;
    a panel disposed above the first set frame and the second set frame;
    a folding hinge configured to connect the first set frame with the second set frame;
    a first sliding plate disposed between the first set frame and the panel;
    a stationary plate disposed between the second set frame and the panel;
    a second sliding plate disposed between the stationary plate and the second set frame; and
    a shock absorber having one end coupled to the first sliding plate and the panel and another end, which is opposite the one end, coupled to the second sliding plate and movably disposed on the folding hinge.

2. The display device of claim 1, wherein the shock absorber is coupled to an upper surface and one side surface of the first sliding plate.

3. The display device of claim 1, wherein the shock absorber is coupled to one side surface of the second sliding plate.

4. The display device of claim 1, wherein the another end of the shock absorber is movably disposed below the stationary plate.

5. The display device of claim 1, wherein the shock absorber is movably located below the panel to cover an upper surface of the folding hinge.

6. The display device of claim 1,
    wherein the first sliding plate includes any one of aluminum (Al), magnesium (Mg), or stainless steel (SUS), and
    wherein the shock absorber includes any one of polyurethane or silicone.

7. The display device of claim 1, wherein the first set frame includes:
    a first sliding section; and
    a first spring fixed to a lower surface of the first sliding plate and provided in the first sliding section.

8. The display device of claim 7, wherein the second set frame includes:
    a second sliding section; and
    a second spring fixed to another side of the second sliding plate, which is opposite to the one side surface of the second sliding plate, and provided in the second sliding section.

9. The display device of claim 1, further comprising a second shock absorber disposed between the stationary plate and the panel.

10. The display device of claim 9, wherein an upper surface of the second shock absorber is coupled to the panel and a lower surface of the second shock absorber is coupled to the stationary plate.

11. The display device of claim 10, wherein the second shock absorber is provided in at least a section in which the shock absorber is not provided.

12. The display device of claim 11, wherein a thickness of the second shock absorber is less than a thickness of the shock absorber.

13. The display device of claim 10, wherein the second shock absorber includes any one of polyurethane or silicone.

14. A display device comprising:
    a panel;
    a folding hinge disposed below the panel;
    a first sliding plate disposed on one side of the folding hinge;
    a second sliding plate disposed on another side of the folding hinge; and
    a shock absorber having one end coupled to the first sliding plate and the panel and another end coupled to the second sliding plate and movably disposed on the folding hinge,
    wherein the one end of the shock absorber is coupled to an upper surface and one side surface of the first sliding plate, and the another end of the shock absorber is coupled to one side surface of the second sliding plate.

15. The display device of claim 14, further comprising a stationary plate disposed above the second sliding plate,
    wherein the another end of the shock absorber is movably disposed below the stationary plate.

16. The display device of claim 15, wherein the shock absorber is movably located below the panel to cover an upper surface of the folding hinge.

17. The display device of claim 16, further comprising a second shock absorber disposed between the stationary plate and the panel.

18. The display device of claim 17, wherein an upper surface of the second shock absorber is coupled to the panel and a lower surface of the second shock absorber is coupled to the stationary plate.

19. The display device of claim 18, wherein the second shock absorber is provided in at least a section in which the shock absorber is not provided.

20. A display device comprising:
- a panel;
- a folding hinge disposed below the panel;
- a first sliding section disposed on one side of the folding hinge;
- a first sliding plate disposed in the first sliding section to be movable by a first spring;
- a second sliding section disposed on another side of the folding hinge;
- a second sliding plate disposed in the second sliding section to be movable by a second spring; and
- a shock absorber having one end coupled to the first sliding plate and the panel, and another end coupled to the second sliding plate and movably disposed on the folding hinge,
- wherein the one end of the shock absorber is coupled to an upper surface and one side surface of the first sliding plate, and the another end of the shock absorber is coupled to one side surface of the second sliding plate.

* * * * *